United States Patent
Graef et al.

[11] Patent Number: 5,935,320
[45] Date of Patent: Aug. 10, 1999

[54] PROCESS FOR PRODUCING SILICON SEMICONDUCTOR WAFERS WITH LOW DEFECT DENSITY

[75] Inventors: Dieter Graef; Wilfried Von Ammon, both of Burghausen; Reinhold Wahlich, Tittmoning; Peter Krottenthaler, Burghausen; Ulrich Lambert, Emmerting, all of Germany

[73] Assignee: Wacker Siltronic Gesellschaft für Halbleitermaterialien AG, Burghausen, Germany

[21] Appl. No.: 08/918,843

[22] Filed: Aug. 26, 1997

[30] Foreign Application Priority Data

Sep. 12, 1996 [DE] Germany ............ 196 37 182

[51] Int. Cl.$^6$ .................................................. C30B 29/06
[52] U.S. Cl. ..................... 117/2; 117/20; 117/66; 117/73; 117/76; 117/916; 117/930; 117/932
[58] Field of Search ..................... 117/2, 20, 66, 117/73, 76, 916, 930, 932

[56] References Cited

U.S. PATENT DOCUMENTS

| | | | |
|---|---|---|---|
| 4,010,064 | 3/1977 | Patrick | 156/617 |
| 4,556,448 | 12/1985 | Kim | 156/605 |
| 4,981,549 | 1/1991 | Yamashita et al. . | |
| 5,264,189 | 11/1993 | Yamashita et al. . | |
| 5,373,804 | 12/1994 | Tachimori | 117/13 |
| 5,575,847 | 11/1996 | Kuramochi et al. . | |

FOREIGN PATENT DOCUMENTS

| | | |
|---|---|---|
| 0170788 | 2/1986 | European Pat. Off. . |
| 0644588 | 3/1995 | European Pat. Off. . |
| 0716168 | 6/1996 | European Pat. Off. . |
| 4442239 | 6/1995 | Germany . |

OTHER PUBLICATIONS

Proceedings of the 18th International Conference on Defects in Semiconductors, Party, Sendai, Japan, Jul. 23–28, 1995, pp. 1731–1735.

Journal of Electrochemical Society, vol. 142, No. 9, Sep. 1995, pp. 3189–3192.

*Primary Examiner*—Robert Kunemund
*Attorney, Agent, or Firm*—Collard & Roe, P.C.

[57] ABSTRACT

A process for producing silicon wafers with low defect density is one wherein a) a silicon single crystal having an oxygen doping concentration of at least $4*10^{17}/cm^3$ is produced by molten material being solidified to form a single crystal and is then cooled, and the holding time of the single crystal during cooling in the temperature range of from 850° C. to 1100° C. is less than 80 minutes; b) the single crystal is processed to form silicon wafers; and c) the silicon wafers are annealed at a temperature of at least 1000° C. for at least one hour. Also, it is possible to prepare a silicon single crystal based upon having an oxygen doping concentration of at least $4*10^{17}/cm^3$ and a nitrogen doping concentration of at least $1*10^{14}/cm^3$ for (a) above.

4 Claims, 3 Drawing Sheets

PROCESS FOR PRODUCING SILICON SEMICONDUCTOR WAFERS WITH LOW DEFECT DENSITY

BACKGROUND OF THE INVENTION

1. Field of the Invention

The present invention relates to a process for producing silicon semiconductor wafers which have a low density of as-grown defects.

2. The Prior Art

It is known that silicon wafers are cut from single crystals and are processed further to form the basic material for producing electronic components. The single crystals are usually produced using the Czochralski method (CZ method) or the float zone method (FZ method). In these methods, molten material, generally doped silicon, is solidified to form a single crystal that cools. In the CZ method, the single crystal is pulled from a melt that resides in a quartz glass crucible. This being the case, oxygen originating from the crucible material dissolves in the melt and is to some extent incorporated into the single crystal. The FZ method is a crucible-free pulling process. Thus, the oxygen concentration in float-zone single crystals (FZ crystals) is substantially lower than in single crystals pulled from crucibles (CZ crystals). There is, however, the possibility of doping FZ crystals with oxygen during their production. Thus, their oxygen concentration reaches values which are comparable with the oxygen doping in CZ crystals. A modified FZ method of this type is, for example, described in U.S. Pat. No. 5,089,082. The doping of FZ crystals with oxygen is, in particular, carried out in order to make the crystal lattice of the single crystal mechanically stronger. This is done also to use oxygen precipitates which, as so-called intrinsic getters, collect metallic impurities.

Neither CZ crystals nor FZ crystals have a perfect crystal lattice. The lattice contains ordering faults, which are referred to as as-grown defects. The term "defects" will be used hereafter exclusively to denote as-grown defects. For the production of electronic components, it is of prime importance for a semiconductor wafer to have the lowest possible defect density. This is particularly important in the region near the surface of the wafer. Any defect located in a region of a silicon wafer close to the surface can interfere with the functioning of an electronic component. This can even lead to failure of the component. The defect densities for FZ wafers are normally substantially lower than the defect densities which are found with CZ wafers. However, in the case of oxygen-doped FZ wafers having an oxygen doping concentration of at least $4*10^{17}/cm^3$, the defect densities reach values which are of the same order as the defect densities in CZ wafers. The doping of single crystals with oxygen, which is unavoidable in the case of CZ crystals, is often desired in the case of FZ crystals. This necessarily leads to high defect densities.

The connection between the defect density and the expected quality of the electronic components suggests the development of single crystals having low defect density. This is especially desirable since it is known that the defect density in a semiconductor wafer can be reduced by a heat-treatment referred to as annealing (M. Sano, M. Hourai, S. Sumita and T. Shigematsu, in Proc. Satellite Symp. to ESSDERC Grenoble/France, B. O. Kolbesen, Editor, p.3, *The Electrochemical Society*, Pennington, N.J. (1993)). Essential parameters during the annealing include the temperature, the annealing time, the atmosphere and the rates of change in temperature. The reduction in defect density is usually more pronounced for higher temperatures and longer annealing times. A disadvantage with this procedure is that long annealing times at high temperatures necessarily increases the production costs for the silicon wafers.

Research work has recently been published (D. Gräf, U. Lambert, M. Brohl, A. Ehlert, R. Wahlich and P. Wagner, *Materials Science and Engineering* B36, 50 (1996)). This research discloses that the defect size plays a part when reducing defect densities by annealing. In addition, research has found that the rate at which a single crystal is cooled during its production affects the size distribution of the defects. However, this research work does not contain any indication of whether and how this discovery can advantageously be employed for the production of silicon wafers.

SUMMARY OF THE INVENTION

It is an object of the present invention to provide an improved process for producing silicon wafers, which makes it possible to obtain silicon wafers having an oxygen doping concentration of at least $4*10^{17}/cm^3$ which have low defect densities, in particular in the region of the wafer near the surface. The oxygen doping concentration refers to the number of monatomic oxygen atoms per cubic centimeter present in the wafer.

The above object is achieved by the process according to the invention for producing silicon wafers with a low defect density comprising the steps of:

a) producing a silicon single crystal having an oxygen doping concentration of at least $4*10^{17}/cm^3$ by solidifying molten material to form the silicon single crystal and by cooling the silicon single crystal, and having a holding time of the silicon single crystal during cooling in a temperature range of from 850° C. to 1100° C. being less than 80 min;

b) processing the silicon single crystal to form silicon wafers; and c) annealing the silicon wafers at a temperature of at least 1000° C. for an annealing time of at least one hour.

The present invention also provides a process for producing silicon wafers with low defect density, comprising the steps of:

a) preparing a silicon single crystal having an oxygen doping concentration of at least $4*10^{17}/cm^3$ and a nitrogen doping concentration of at least $1*10^{14}/cm^3$;

b) processing the silicon single crystal to form silicon wafers; and c) annealing the silicon wafers at a temperature of at least 1000° C. for at least one hour.

It has been found that step a) of the process has the effect that the defect density in the single crystal is increased considerably. This is in comparison with the defect densities which are found with comparison crystals that are allowed to cool more slowly in the specified temperature range. Accordingly, semiconductor wafers which are produced from a defect-rich single crystal of this type, seem unsuitable as basic material for the production of electronic components. However, the increased defect density is associated with such a shift in the defect size distribution to small defects. These are defects with a smaller spatial extent such that the defect reduction by annealing the semiconductor wafers, according to step c), is unusually efficient. It is so effective that the defect density which is found after the annealing is lower than the defect density of equivalently treated comparison wafers. These comparison wafers were produced from the above-mentioned comparison crystals.

An explanation of this result is found if it is assumed that small defects are eliminated preferentially during the annealing. In contrast, the larger defects are not removed during the annealing. The larger defects remain, and the number of them has a decisive effect on the detectable defect density in the annealed silicon wafer. With a view to low-defect silicon wafers, this means that the importance of the defect density in the single crystal decreases as the proportion of small defects in the defect size distribution increases. Step a) of the process ensures that the proportion of small defects is as great as possible and the proportion of large defects is as small as possible. The small defects are substantially eliminated during step c) of the process, so that the annealed silicon wafers then have only small defect densities.

It has furthermore been found that doping the single crystal with nitrogen also affects the defect size distribution. For single crystals which are doped with nitrogen and have a nitrogen doping concentration of at least $1*10^{14}/cm^3$, the defect size distribution is shifted. This shift is likewise advantageously in favor of small defects. This shift is in comparison with the defect size distribution of comparison crystals that are not doped with nitrogen. Silicon wafers which are produced from a nitrogen-doped single crystal therefore likewise have only small defect densities after a treatment according to step c) of the process. The nitrogen doping concentration refers to the number of monatomic nitrogen atoms per cubic centimeter present in the crystal or in the wafer.

The doping of the single crystal with nitrogen can take place during the production of the single crystal according to step a) of the process. Basically, however, it is sufficient to prepare a nitrogen-doped silicon single crystal having an oxygen doping concentration of at least $4*10^{17}/cm^3$ and having a nitrogen doping concentration of at least $1*10^{14}/cm^3$. This doped single crystal is then treated further according to steps b) and c) of the process of the invention. The doping of the single crystal with nitrogen can thus take place as a replacement for the rapid cooling of the single crystal. This rapid cooling occurs in the specified temperature range of from 850° C. to 1100° C., which is required in step a) of the process of the invention.

Tests have shown that the effect of doping the single crystal with nitrogen in terms of the defect size distribution must also be considered in connection with the doping of the single crystal with oxygen. For the same nitrogen-doping, the proportion of small defects increases as the oxygen-doping decreases.

In order to carry out the process of the invention, a single crystal is produced by employing the CZ method or the FZ method. The basics of the two production methods are, for example, described in *Ullmann's Encyclopedia of Industrial Chemistry*, vol. A23, p.727–731 (1993). When the FZ method is employed, the oxygen doping preferably takes place as described in U.S. Pat. No. 5,089,082. The required rapid cooling of the single crystal according to step a) of the process is not essential when the FZ method is employed. This is because a float-zone single crystal cools rapidly by the very nature of the float-zone process. It remains for less than 80 minutes in the temperature range of from 850° C. to 1100° C. When the CZ method is employed, forced cooling should preferably be used to ensure that the single crystal cools at the required rate in this temperature range. A device for forced cooling of the single crystal is, for example, described in DE-195 03 357 A1.

The doping of a silicon single crystal with nitrogen usually takes place during the production of the single crystal. This occurs by having the single crystal grow in a nitrogen-containing environment that acts as a dopant source.

The processing of a single crystal to form silicon wafers has been described within the scope of the prior art. Use is usually made of annular or wire saws for slicing silicon wafers from the single crystal. In order to determine the defect density, and also the defect size distribution, the silicon wafers must be prepared. Various preparation methods are known. Since the characterization of the defects depends essentially on the preparation method that is used, it is not possible to give absolute indications of the defect sizes. Evaluations of the defect sizes and defect size distributions can be compared with one another only if they are based on the same preparation method.

According to one method (COP test), silicon wafers are subjected to a treatment with a so-called SC1 solution. This makes defects visible as "crystal originated particles" (COP). The defects are then investigated using a commercial surface inspection instrument, known from the prior art.

A quantitative conclusion regarding the presence of defects is also made possible by a so-called GOI examination (GOI stands for "gate oxide integrity"). In this case, the electrical breakdown potential of an oxide layer applied to the surface of the silicon wafer is tested. In this method, the defect characterization is done by specifying a GOI defect density. It has already been shown that the results of a GOI examination and the results of a COP test correlate well with one another (M. Brohl, D. Gräf, P. Wagner, U. Lambert, H. A. Gerber, H. Piontek, ECS Fall Meeting 1994, p.619, *The Electrochemical Society*, Pennington, N.J. (1994)).

The process according to step c) of the invention comprises a heat-treatment (annealing) of the silicon wafers at a temperature of at least 1000° C., preferably 1100° C. to 1200° C., and an annealing time of at least one hour. The silicon wafers can be annealed individually or in groups. The atmosphere used is preferably a gas which is selected from the group consisting of the noble gases, such as helium, neon, or argon, or other gases such as oxygen, nitrogen, an oxygen/nitrogen mixture and hydrogen. Hydrogen or argon is preferred.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

In each of FIGS. 1 to 6, "a.u." means arbitrary unit.

DETAILED DESCRIPTION OF PREFERRED EMBODIMENTS

The present invention will now be further described by reference to the following examples which are not to be deemed limitative of the present invention in any manner thereof.

EXAMPLE 1

Various single crystals having a diameter of 200 mm were produced according to the CZ method and were processed to form silicon wafers of category CZ1–CZ3. In all the single crystals, the oxygen concentration was above the value of $5*10^{17}/cm^3$. In the case of silicon wafers of category CZ1, the growing single crystal was actively cooled and the holding time of the cooling crystal in the temperature range from 850° C. to 1100° C. was less than 80 minutes. In the case of the comparison wafers of category CZ2 and CZ3, forced cooling was omitted during the pulling of the single crystal, and the holding times in this temperature interval were more than 80 minutes.

For defect characterization, silicon wafers of all three categories were subjected to a GOI examination as well as a COP test. The surface inspection instrument used to evaluate the COP test could detect defects that were larger than 0.12 μm.

Silicon wafers of all three categories were then annealed at a temperature of 1200° C. and with an annealing time of two hours in an argon atmosphere and, as before, examined for defects.

Figure 1:
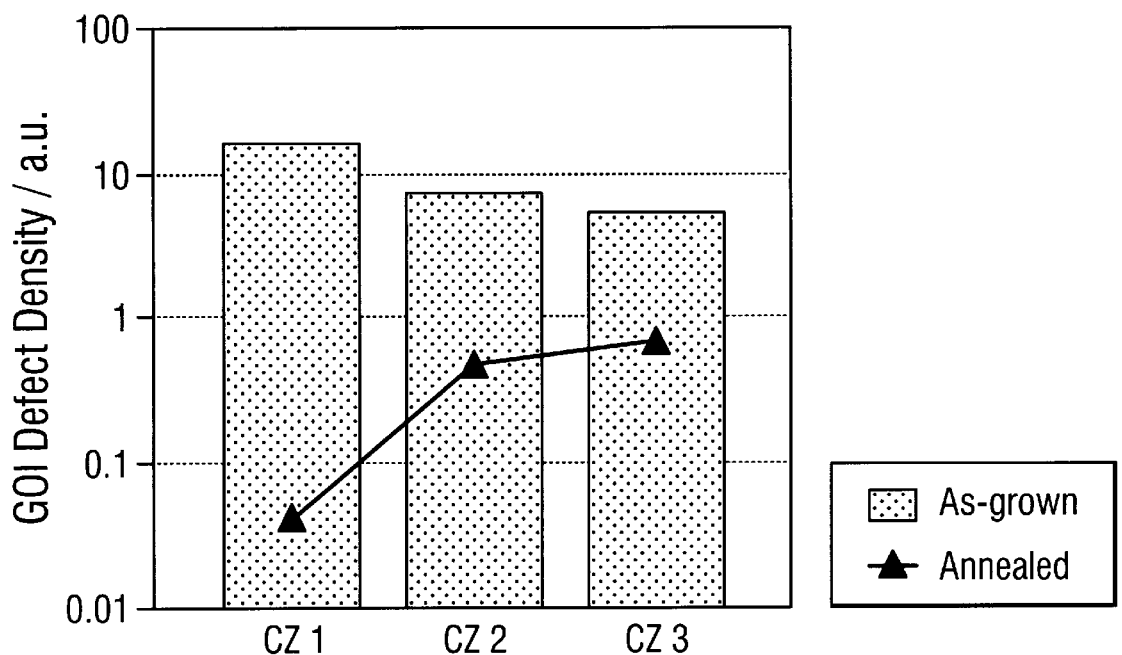
FIG. 1 shows GOI defect density as a function of CZ methods and examination test results.
Figure 2:
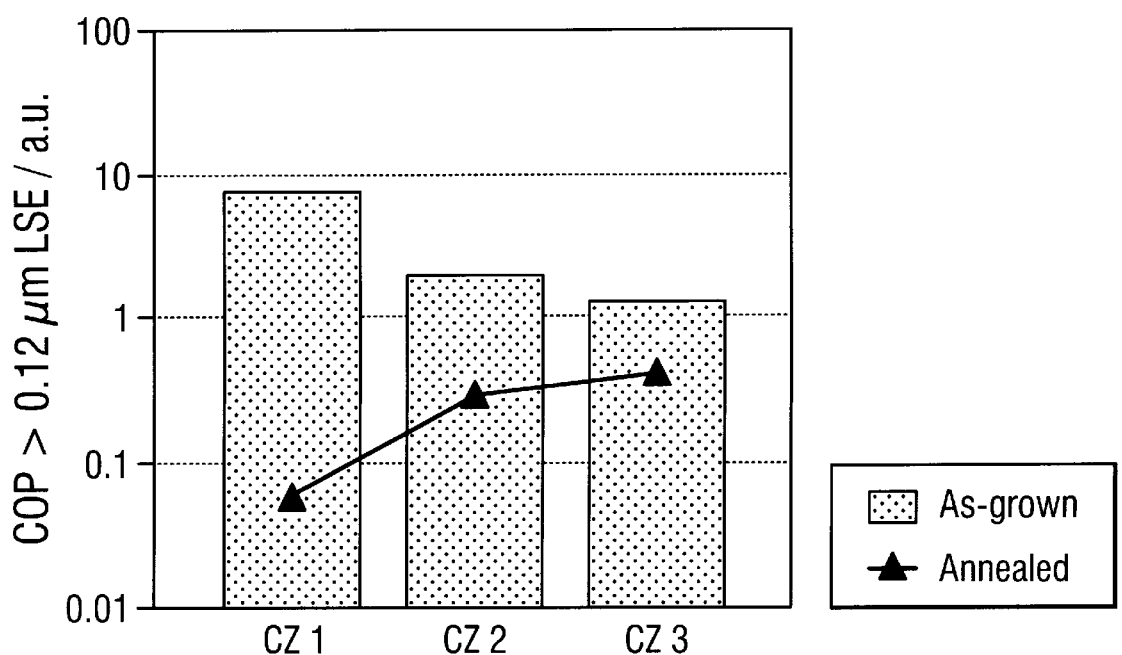
FIG. 2 shows the results of COP tests as a function of CZ methods.

The result of the GOI examination is represented in FIG. 1, and the result of the COP test is represented in FIG. 2. Before the heat treatment of these silicon wafers, the GOI defect densities increased in the order CZ3–CZ1. After the annealing, this trend was reversed and the GOI defect densities increased in the order CZ1–CZ3. Although the defect densities of all the silicon wafers were reduced by the annealing, the defect density reduction was the most pronounced for the silicon wafers of category CZ1.

Figure 3:
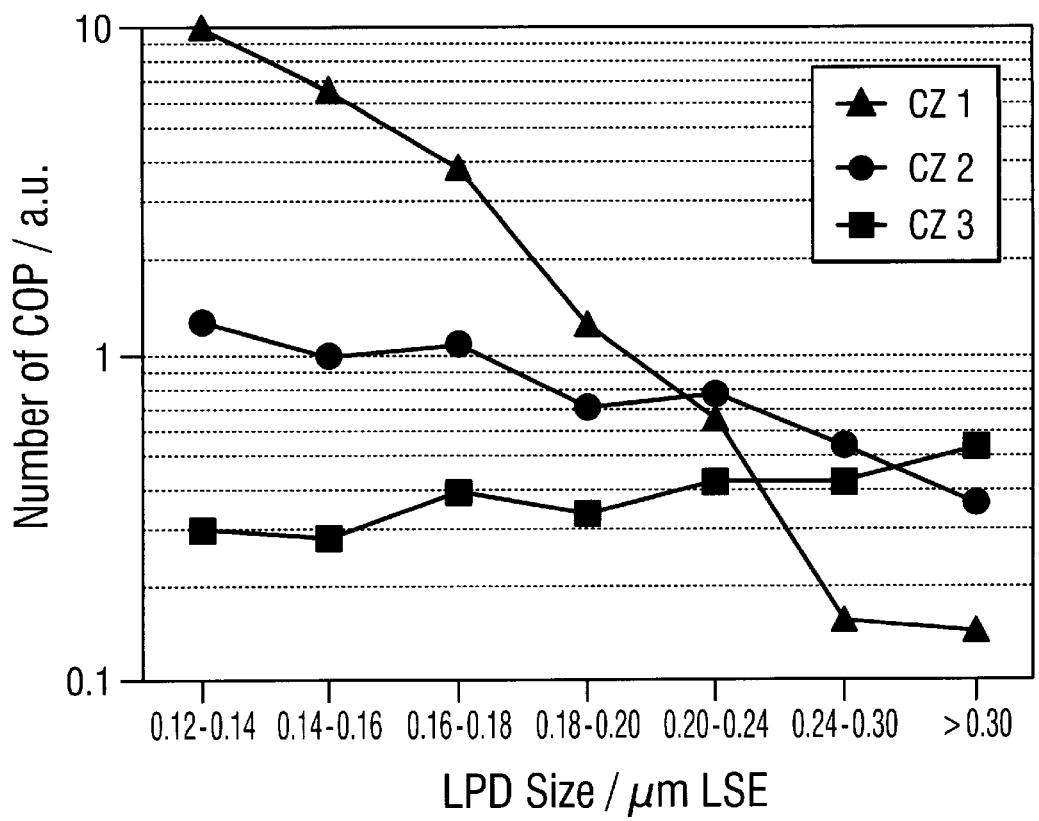
FIG. 3 shows the defect size distribution for the silicon wafers before the annealing.

FIG. 3 shows the defect size distribution for the silicon wafers before the annealing. The defect sizes for the silicon wafers of categories CZ2 and CZ3 are distributed almost uniformly over the measuring range. However, the proportion of small defects is strikingly high for the silicon wafers of category CZ1 and the proportion of large defects is strikingly low.

Figure 4:
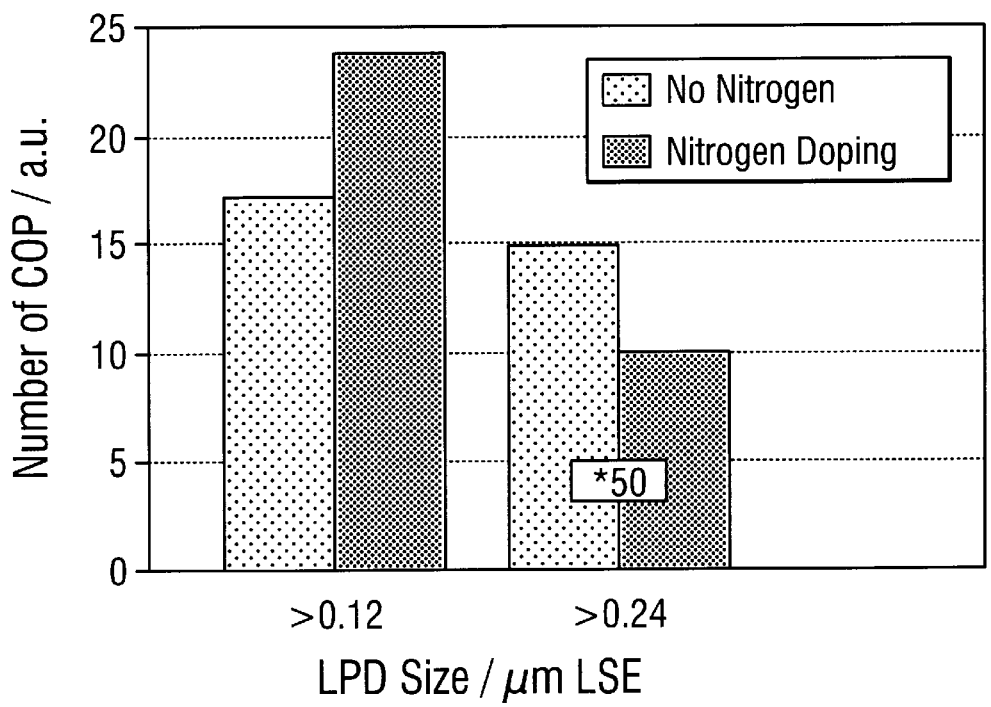
FIG. 4 shows an analysis of the defect size distribution for the silicon wafers both with and without a nitrogen doping.
Figure 5:
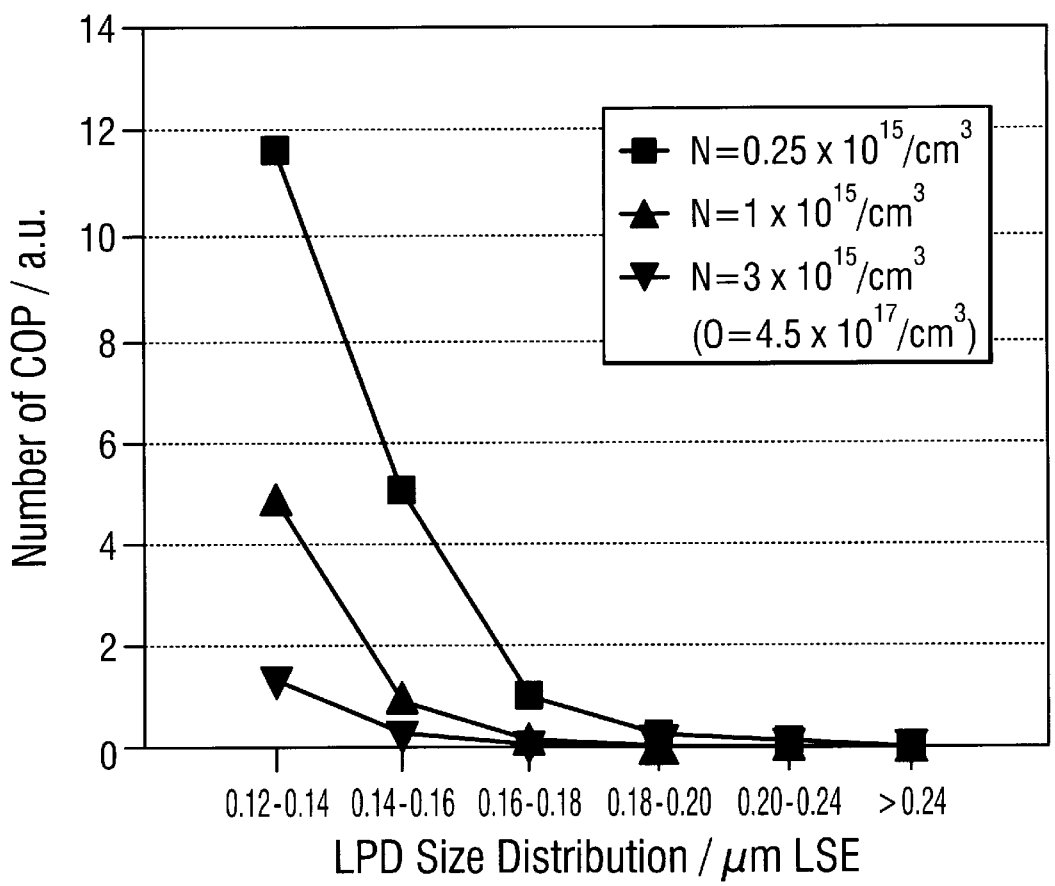
FIG. 5 shows the defect size distribution that was determined.

FIGS. 3, 4, and 5 "LPD" refers to the light point defects, while "LSE" refers to latex sphere equivlents for the particle defects for FIGS. 2 to 5.

EXAMPLE 2

Two different single crystals having a diameter of 200 mm were produced according to the CZ method and processed to form silicon wafers. Only one of the two single crystals was doped with nitrogen, and it had a nitrogen concentration of $3*10^{14}/cm^3$. In both of the single crystals, the oxygen concentration was $9*10^{17}/cm^3$. The results of the analysis of the defect size distribution for the silicon wafers is shown in FIG. 4. Thus, FIG. 4 shows that a nitrogen doping produced a shift in the defect size distribution toward smaller defects.

In FIG. 4, *50 indicates a magnification of the bars. The actual numbers of COP>0.24 μm are a factor of 50 lower as given by the scale reading.

EXAMPLE 3

Three silicon crystals having a diameter of 125 mm were produced according to the FZ method and were processed to form silicon wafers o category FZ1–FZ3. All the silicon wafers were doped with oxygen, and the oxygen concentration was $4.5*10^{17}/cm^3$. The nitrogen doping was selected as follows:

| Category | Dopant Concentration |
|---|---|
| FZ1 | $2.5*10^{14}/cm^3$ |
| FZ2 | $1.0*10^{15}/cm^3$ |
| FZ3 | $3.0*10^{15}/cm^3$ |

Silicon wafers of all categories were firstly subjected to a COP test.

FIG. 5 shows the defect size distribution that was determined. It can be seen that the proportion of large defects decreases greatly with the increase in the degree of nitrogen doping. The representation of the size distribution in the small defect range is incomplete since measurements were possible only up to the detection limit of the surface inspection instrument.

Figure 6:
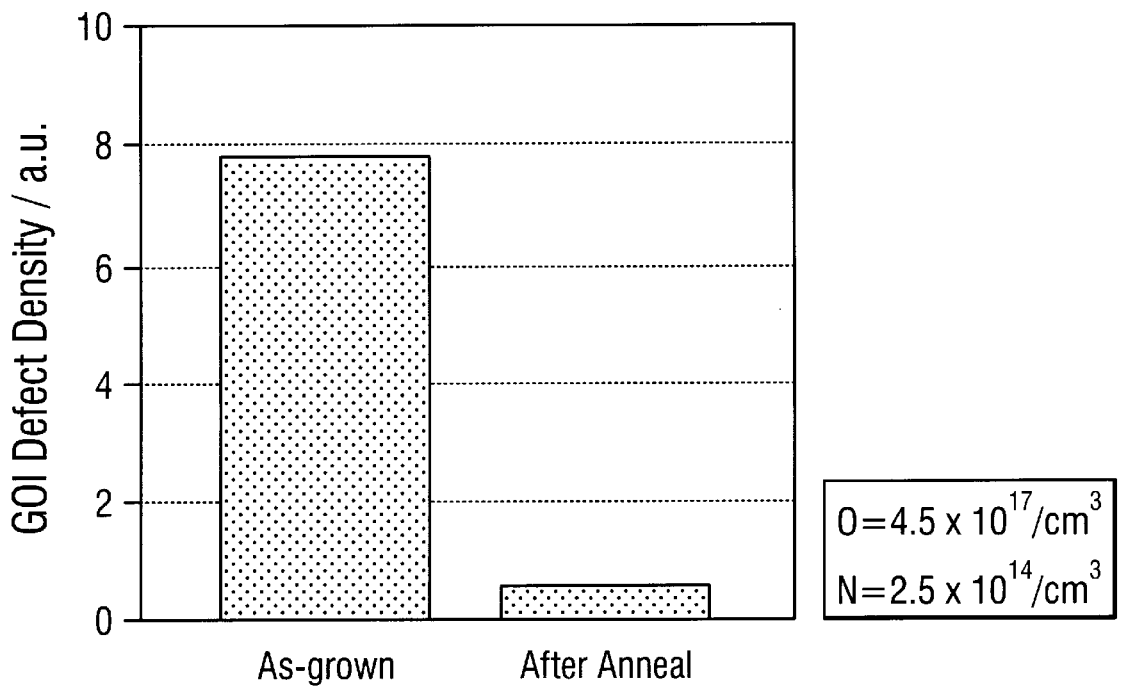
FIG. 6 shows the GOI defect density in the silicon wafers both before and after annealing.

Silicon wafers of category FZ1 were annealed at 1200° C. in an oxygen/nitrogen atmosphere for three hours. FIG. 6 shows the results of a GOI examination which was carried out on the silicon wafers before and after the heat treatment. A considerable improvement in the GOI defect densities is shown. This can be attributed to the elimination of the small defects during the heat treatment.

While several embodiments of the present invention have been shown and described, it is to be understood that many changes and modifications may be made thereunto without departing from the spirit and scope of the invention as defined in the appended claims.

What is claimed is:

1. A process for producing silicon wafers with low defect density, comprising the steps of:

a) producing a silicon single crystal having an oxygen doping concentration of at least $4*10^{17}/cm^3$ by solidifying molten material to form the silicon single crystal and by cooling the silicon single crystal, and having a holding time of the silicon single crystal during cooling in a temperature range of from 850° C. to 1100° C. being less than 80 minutes,
   such that the proportion of small defects is as great as possible and the proportion of large defects is as small as possible;

b) processing the silicon single crystal to form silicon wafers; and c) annealing the silicon wafers at a temperature of at least 1000° C. for at least one hour in an atmosphere selected from the group consisting of noble gases, nitrogen and hydrogen,
   such that the small defects are substantially eliminated during said annealing so that the annealed silicon wafers then have only small defect densities.

2. The process as claimed in claim 1, comprising
   doping the silicon single crystal with nitrogen during step a) to produce a nitrogen doping concentration of at least $1*10^{14}/cm^3$.

3. The process as claimed in claim 1, comprising
   subjecting the silicon single crystal to forced cooling when it cools during step a).

4. A process for producing silicon wafers with low defect density, comprising the steps of:

a) preparing a silicon single crystal having an oxygen doping concentration of at least $4*10^{17}/cm^3$ and a nitrogen doping concentration of at least $1*10^{14}/cm^3$, such that the proportion of small defects is as great as possible and the proportion of large defects is as small as possible;

b) processing the silicon single crystal to form silicon wafers; and c) annealing the silicon wafers at a temperature of at least 1000° C. for at least one hour in an atmosphere selected from the group consisting of noble gases, nitrogen and hydrogen, such that the small defects are substantially eliminated during the annealing so that the annealed silicon wafers then have only small defect densities.

* * * * *